(12) United States Patent
Liao et al.

(10) Patent No.: US 7,133,317 B2
(45) Date of Patent: Nov. 7, 2006

(54) METHOD AND APPARATUS FOR PROGRAMMING NONVOLATILE MEMORY

(75) Inventors: Yi Ying Liao, Sijhih (TW); Chih Chieh Yeh, Taipei (TW); Wen Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/064,316

(22) Filed: Feb. 23, 2005

(65) Prior Publication Data

US 2006/0109717 A1   May 25, 2006

Related U.S. Application Data

(60) Provisional application No. 60/629,735, filed on Nov. 19, 2004.

(51) Int. Cl.
*G11C 16/04* (2006.01)
(52) U.S. Cl. .............................. 365/185.28; 365/185.18
(58) Field of Classification Search ........... 365/185.16, 365/185.18, 185.29, 185.28, 185.33
See application file for complete search history.

(56) References Cited

U.S. PATENT DOCUMENTS

| | | | |
|---|---|---|---|
| 4,959,812 A | 9/1990 | Momodomi et al. | |
| 5,270,969 A | 12/1993 | Iwahashi | |
| 5,278,439 A | 1/1994 | Ma et al. | |
| 5,355,464 A | 10/1994 | Fandrich et al. | |
| 5,408,115 A | 4/1995 | Chang | |
| 5,424,569 A | 6/1995 | Prall | |
| 5,448,517 A | 9/1995 | Iwahashi | |
| 5,483,486 A | 1/1996 | Javanifard et al. | |
| 5,485,422 A | 1/1996 | Bauer et al. | |

(Continued)

FOREIGN PATENT DOCUMENTS

JP        09162313        6/1997

(Continued)

OTHER PUBLICATIONS

U.S. Appl. No. 11/085,444, filed Mar. 21, 2005, entitled "Method for Manufacturing a Multiple-Gate Charge Trapping Non-Volatile Memory," 71 pages.

(Continued)

*Primary Examiner*—Gene N. Auduong
(74) *Attorney, Agent, or Firm*—Kenta Suzue; Haynes Beffel & Wolfeld LLP

(57) ABSTRACT

Programming nonvolatile memory cells is affected by the program disturb effect which causes data accuracy issues with nonvolatile memory. Rather than masking the voltage conditions that cause the program disturb effect, voltages are applied to neighboring nonvolatile memory cells, which takes advantage of the program disturb effect to program multiple cells quickly.

42 Claims, 6 Drawing Sheets

U.S. PATENT DOCUMENTS

| | | | |
|---|---|---|---|
| 5,509,134 | A | 4/1996 | Fandrich et al. |
| 5,515,324 | A | 5/1996 | Tanaka |
| 5,566,120 | A | 10/1996 | D'Souza |
| 5,602,775 | A | 2/1997 | Vo |
| 5,644,533 | A | 7/1997 | Lancaster et al. |
| 5,694,356 | A | 12/1997 | Wong et al. |
| 5,745,410 | A | 4/1998 | Yiu et al. |
| 5,768,192 | A | 6/1998 | Eitan |
| RE35,838 | E | 7/1998 | Momodomi et al. |
| 5,895,949 | A | 4/1999 | Endoh et al. |
| 5,966,603 | A | 10/1999 | Eitan |
| 6,011,725 | A | 1/2000 | Eitan |
| 6,034,896 | A | 3/2000 | Ranaweera et al. |
| 6,074,917 | A | 6/2000 | Chang et al. |
| 6,096,603 | A | 8/2000 | Chang et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,458,642 | B1 | 10/2002 | Yeh et al. |
| 6,487,114 | B1 | 11/2002 | Jong et al. |
| 6,512,696 | B1 | 1/2003 | Fan et al. |
| 6,538,923 | B1 | 3/2003 | Parker |
| 6,552,386 | B1 | 4/2003 | Wu |
| 6,566,699 | B1 | 5/2003 | Eitan |
| 6,587,903 | B1 | 7/2003 | Roohparvar |
| 6,614,070 | B1 | 9/2003 | Hirose et al. |
| 6,614,694 | B1 | 9/2003 | Yeh et al. |
| 6,643,181 | B1 | 11/2003 | Sofer et al. |
| 6,643,185 | B1 | 11/2003 | Wang et al. |
| 6,646,924 | B1 | 11/2003 | Tsai et al. |
| 6,657,894 | B1 | 12/2003 | Yeh et al. |
| 6,670,240 | B1 | 12/2003 | Ogura et al. |
| 6,670,671 | B1 | 12/2003 | Sasago et al. |
| 6,690,601 | B1 | 2/2004 | Yeh et al. |
| 6,714,457 | B1 | 3/2004 | Hsu et al. |
| 6,795,342 | B1* | 9/2004 | He et al. ............... 365/185.16 |
| 6,912,163 | B1 | 6/2005 | Zheng et al. |
| 6,937,511 | B1 | 8/2005 | Hsu et al. |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |

FOREIGN PATENT DOCUMENTS

| | | |
|---|---|---|
| JP | 11233653 | 8/1999 |
| WO | WO 94/28551 | 12/1994 |

OTHER PUBLICATIONS

U.S. Appl. No. 10/855,286, filed May 26, 2004, entitled "Nand-Type Non-Volatile Memory Cell and Method for Operating Same," 15 pages.

U.S. Appl. No. 11/085,458, filed Mar. 21, 2005, entitled "Charge Trapping Non-Volatile Memory and Method for Gate-by-Gate Erase for Same," 73 pages.

U.S. Appl. No. 11/085,325, filed Mar. 21, 2005, entitled "Memory Array Including Multiple-Gate Charge Trapping Non-Volatile Cells," 74 pages.

U.S. Appl. No. 11/085,326, filed Mar. 21, 2005, entitled "Charge Trapping Non-Volatile Memory With Two Trapping Locations Per Gate, and Method for Operating Same," 73 pages.

U.S. Appl. No. 11/085,300, filed Mar. 21, 2005, entitled "Charge Trapping Non-Volatile Memory and Method for Operating Same," 73 pages.

Fujiwara,I., et al., "0.13 μm MONOS single transistor memory cell with separated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Yeh, C.C., et al., "PHINES: A Novel Low Power Program/Erase, Small Pitch, 2-Bit per Cell Flash Memory," IEEE IEDM, 2002, 931-934.

Sasago, Y, et al., "90-nm-node multi-level AG-AND type flash memory with cell size of true 2 F2/bit and programming throughput of 10 MB/s," IEEE, 2003, 4 pages.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

U.S. Appl. No. 11/118,839, filed Apr. 29, 2005, "Inversion Bit Line, Charge Trapping Non-Volatile Memory and Method of Operating Same".

Tsai, Wen Jer et al., U.S. Appl. No. 10/289,866, filed Nov. 6, 2002, entitled "Erasing Method for Non-Volatile Memory," 24 pages.

Bude, J.D., et al., "Secondary Electron Flash—a High Performance, Low Power Flash Technology for 0.35 μm and Below," Electron Devices Meeting, 1997. Technical Digest., International, Dec. 7-10, 1997, 279-282.

Chung, Steve S., "Low Voltage/Power and High Speed Flash Memory Technology for High Performance and Reliability," The 3rd WIMNACT—Singapore, Oct. 15, 2003, 1-48.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1-26.6.4.

De Blauwe, Jan, "Nanocrystal Nonvolatile Memory Devices," IEEE Transactions on Nanotechnology, vol. 1, No. 1, Mar. 2002, 72-77.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pluse 24 pages from outline.

Janai, Meir, "Data Retention, Endurance and Acceleration Factors of NROM Devices," IEEE 41st Annual International Reliability Physics Symposium, Dallas, Texas, 2003, 502-505.

Lee, Chang Hyun, et al. "A Novel SONOS Structure of SiO2/SiN/Al2O3 with TaN Metal Gate for Multi-Giga Bit Flash Memeries," Electron Devices Meeting, 2003. IEDM '03 Technical Digest, IEEE International, Dec. 8-10, 2003, 26.5.1-26.5.4.

Lee, Changhyun, et al., "A Novel Structure of SiO2/SiN/High k Dielectrics, Al2O3 for SONOS Type Flash Memory," Extended Abstracts of the 2002 International Conference on Solid State Devices and Materials. Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng et al., "A New Programming Technique for Flash Memory Devices," International Symposium on VLSI Technology, Systems and Applications, Jun. 8-10, 1999, 195-198.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Shin, Yoocheol, et al., "High Reliable SONOS-type NAND Flash Memory Cell with Al2O3 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.

White, Marvin, H., et al., "On the Go with SONOS," Circuits and Devices Magazine, IEEE, vol. 16, Issue: 4, Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International , Dec. 8-10, 2003, pp. 7.5.1-7.5.4.

Eitan, Boaz, "Can NROM, a 2-bit, Trapping Storage NVM Cell, Give a Real Challenge to Floating Gate Cells?" SSDM, Tokyo, Japan (1999), 3 pages.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop. Monterey, CA (Aug. 2001) 2 pages.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

* cited by examiner

METHOD AND APPARATUS FOR PROGRAMMING NONVOLATILE MEMORY

REFERENCE TO RELATED APPLICATION

This application claims the benefit of provisional Application Ser. No. 60/629,735 filed 19 Nov. 2004, which application is hereby incorporated by reference as if fully set forth herein.

This application is related to Pat. No. 6,657,894, issued 2 Dec. 2003, entitled "Apparatus and method for Programming Virtual Ground Nonvolatile Memory Cell Array Without Disturbing Adjacent Cells."

BACKGROUND OF THE INVENTION

1. Field of the Invention

The present technology relates to nonvolatile memory cells, and in particular to nonvolatile memory cells subject to the program disturb effect.

2. Description of Related Art

The program operation of a nonvolatile memory cell is complicated by the program disturb effect. Programming refers to adding charge to, or removing charge from, selected memory cells of a memory array, unlike the indiscriminate erase operation which resets typically an entire sector of memory cells to the same charge storage state. The invention encompasses both products and methods where programming refers to making the net charge stored in the charge trapping structure more negative or more positive, and products and methods where erasing refers to making the net charge stored in the charge trapping structure more negative or more positive. In the program disturb effect, programming of a selected cell leads to unwanted programming of unselected memory cells adjacent to the selected cell. In particular, the program disturb effect leads to unwanted programming of memory cells that are: 1) located in columns adjacent to the column including the selected cell and 2) connected to the selected row line (the word line providing a gate voltage to the selected cell). The integrity of the memory array is adversely affected by these problems.

A prior approach of addressing the read disturb effect alleviated the conditions giving rise to the unwanted programming of unselected memory cells. Unselected memory cells are programmed because of an unwanted voltage difference across the bit lines connected to the unselected memory cells which are in the column adjacent to the column including the selected cell. For example, if a bit line voltage is raised to program a memory cell positioned on one side of the bit line, the program disturb effect tends to program the adjacent memory cell on the other side of the bit line as well. The unwanted programming of unselected memory cells is prevented by decreasing the magnitude of the unwanted voltage difference across the bit lines connected to the unselected memory cells which are in the column adjacent to the column including the selected cell. For example, of the two bit lines that are used for accessing the column adjacent to the column including the memory cell selected to be programmed, when a program voltage is applied to one of those two bit lines to program the selected memory cell, the voltage of the other bit line is changed to decrease the unwanted voltage difference.

This prevention mechanism masks the underlying tendency towards the program disturb effect, but does not prevent the underlying tendency leading to the program disturb effect. Because the program disturb effect is an intrinsic effect of many programming mechanisms, it would be advantageous to somehow take advantage of the program disturb effect, rather than simply applying voltages to other bit lines for the sole purpose of counteracting the voltage conditions that give rise to the program disturb effect.

SUMMARY OF THE INVENTION

Various embodiments of the present invention are directed to a nonvolatile memory and a method for programming the memory. Rather than applying voltage settings to the bit lines only to counteract the program disturb effect, various embodiments take advantage of the program disturb effect to program nonvolatile memory in units of at least two memory cells.

A common architecture of a nonvolatile memory array arranges the memory cells in row and columns. Each of the memory cells includes a body; two current terminals in the body, a bottom dielectric, a charge trapping structure having parts corresponding to the each current terminal (and each part having a charge storage state), a top dielectric.

Word lines control access to the row of the nonvolatile memory array. Each word line provides a gate voltage to the top dielectric of the memory cells in a particular row of memory cells. Bit lines access the columns of memory cells via the current terminals of the memory cells.

At least three particular bit lines access memory cells are arranged with respect to the memory cells in at least two columns of the memory array as follows. A first bit line accesses a first current terminal of memory cells in the first column and the second column. A second bit line accesses a second current terminal of memory cells in the first column. A third bit line accesses the second current terminal of memory cells in is the second column. In this fashion, the first current terminals of adjacent memory cells in neighboring columns are accessed by a same bit line, and the second current terminals of these adjacent memory cells in neighboring columns are accessed by different bit lines.

In one embodiment, the program command is to add charge to a memory cell in the first column and to a memory cell in the second column. A voltage is applied to the word line that supplies the gate voltage to at least the memory cell in the first column and to the memory cell in the second column. The gate voltage is sufficient to move energetic charge from the body of memory cells across the bottom dielectric into the charge trapping structure. For example, if energetic charge had been induced in the body of a memory cell by current mechanisms (for example, such as CHISEL, CHE, Fowler-Nordheim tunneling, band-to-band hot hole tunneling) then the gate voltage is sufficient to move this energetic charge. A voltage is applied to the first bit line, which accesses memory cells in at least the first column and second column to be programmed. This voltage is sufficient to induce the energetic charge (for example, via CHISEL, CHE, Fowler-Nordheim tunneling, band-to-band hot hole tunneling) in the bodies of memory cells that have at least a sufficient voltage difference between their current terminals. Finally, a voltage setting is applied to the second and third bit lines, which are the remaining bit lines that access memory cells in at least the first column and second column to be programmed. The voltage setting can cause the same voltage to be applied to the second and third bit lines for simplicity, or different voltages on the second and third bit lines for flexibility. This voltage setting causes at least a sufficient voltage difference between the current terminals of memory cells in at least the first column and the second column to induce the energetic charge (for example, via CHISEL, CHE, Fowler-Nordheim tunneling, band-to-band hot hole tunneling) in the bodies of memory cells in the memory cells. Because of this sufficient voltage difference and the successful inducement of energetic charge in the bodies of the memory cells, the gate voltage and the voltage applied to the first bit line add charge to the memory cells.

In another embodiment, the program command is to not add charge to a memory cell in the first column and to a memory cell in the second column. Rather than applying voltage setting to the second and third bit lines that causes at least a sufficient voltage difference between the current terminals of memory cells in at least the first column and the second column to induce the energetic charge in the bodies of memory cells, the voltage setting causes an insufficient voltage difference between the current terminals of memory cells in the first column and the second column that fails to induce the energetic charge in the bodies of the memory cells. Because of this insufficient voltage difference and the failure to induce energetic charge in the bodies of the memory cells, the gate voltage and the voltage applied to the first bit line do not add charge to the memory cells.

In another embodiment, the voltage setting is applied to the second and third bit lines depending on the program command as follows:

A) if the program command is to add charge to the charge trapping structure of the memory cells in the first and second columns, applying the voltage setting to the second and third bit lines to cause at least the sufficient voltage difference between the current terminals of the memory cells to induce the energetic charge in the bodies of the first and second columns of memory cells;

B) if the program command is to not add charge to the charge trapping structure of the memory cells in the first and second columns, applying the voltage setting to the second and third bit lines to cause an insufficient voltage difference between the current terminals failing to induce the energetic charge in the bodies of the first and second columns of memory cells;

C) if the program command is to add charge to the charge trapping structure of at least one memory cell in the first column and not add charge to the charge trapping structure of at least one memory cell in the second column, applying the voltage setting to the second and third bit lines to cause: 1) at least the sufficient voltage difference between the current terminals of the first column of memory cells to induce the energetic charge in the bodies of the first column of memory cells and 2) the insufficient voltage difference between the current terminals of the second column of memory cells failing to induce the energetic charge in the bodies of the second column of memory cells; and D) if the program command is to not add charge to the charge trapping structure of at least one memory cell in the first column and add charge to the charge trapping structure of at least one memory cell in the second column, applying the voltage setting to the second and third bit lines to cause: 1) the insufficient voltage difference between the current terminals of the first column of memory cells failing to induce the energetic charge in the bodies of the first column of memory cells and 2) at least the sufficient voltage difference between the current terminals of the second column of memory cells to induce the energetic charge in the bodies of the second column of memory cells.

Various embodiments cover the methods of programming the memory cell and the integrated circuit with the nonvolatile memory array.

The invention covers not only the programming of just two memory cells at a time, but three or more as well.

DETAILED DESCRIPTION

Figure 1:
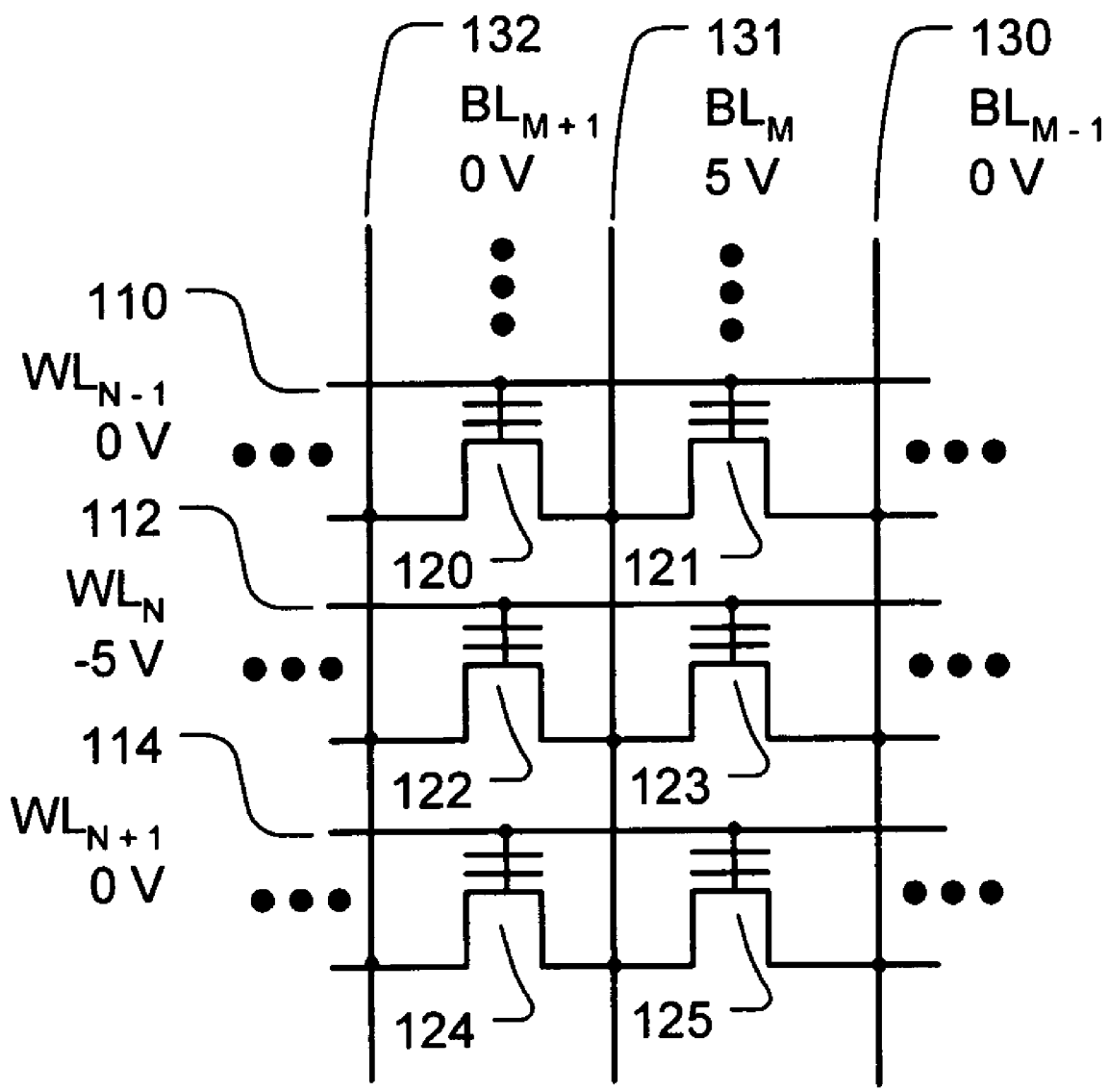
FIG. 1 is a simplified diagram of a portion of an array of nonvolatile memory cells showing the addition of charge to neighboring cells.

FIG. 1 is a simplified diagram of a portion of an array of nonvolatile memory cells. Word line $WL_{N-1}$ 110 supplies a gate voltage of 0 V to the row of nonvolatile memory cells 120 and 121. Word line $WL_N$ 112 supplies a gate voltage of −5 V to the row of nonvolatile memory cells 122 and 123. Word line $WL_{N+1}$ 114 supplies a gate voltage of 0 V to the row of nonvolatile memory cells 124 and 125. Bit line $BL_M$ 131 supplies a voltage of 5 V to a first current terminal of the first column of memory cells 120, 122, and 124, and to a first current terminal of the second column of memory cells 121, 123, and 125. Bit line $BL_{M+1}$ 132 supplies a voltage of 0 V to a second current terminal of the first column of memory cells 120, 122, and 124. Bit line $BL_{M-1}$ 130 supplies a voltage of 0 V to a second current terminal of the second column of memory cells 121, 123, and 125. The charge storage state of the charge storage structure of nonvolatile memory cells 122 and 123 are programmed. The charge storage state of the charge storage structure of nonvolatile memory cells 120, 121, 124, and 126 are not programmed because of gate voltage that is insufficient to move energetic charge in the bodies of the nonvolatile memory cells across the bottom dielectric into the charge trapping structure. The charge trapping structure of each of the nonvolatile memory cells 120, 121, 122, 123, 124, and 125 has parts corresponding to the different current terminals. In nonvolatile memory cells 122 and 123, the charge is added to the charge trapping structure via band-to-band hot holes. More specifically, the charge trapping structure by the bit line $BL_M$ 131 has charge added. This type of programming has the advantage of speed, by simultaneously programming nonvolatile memory cells 122 and 123.

Figure 2:
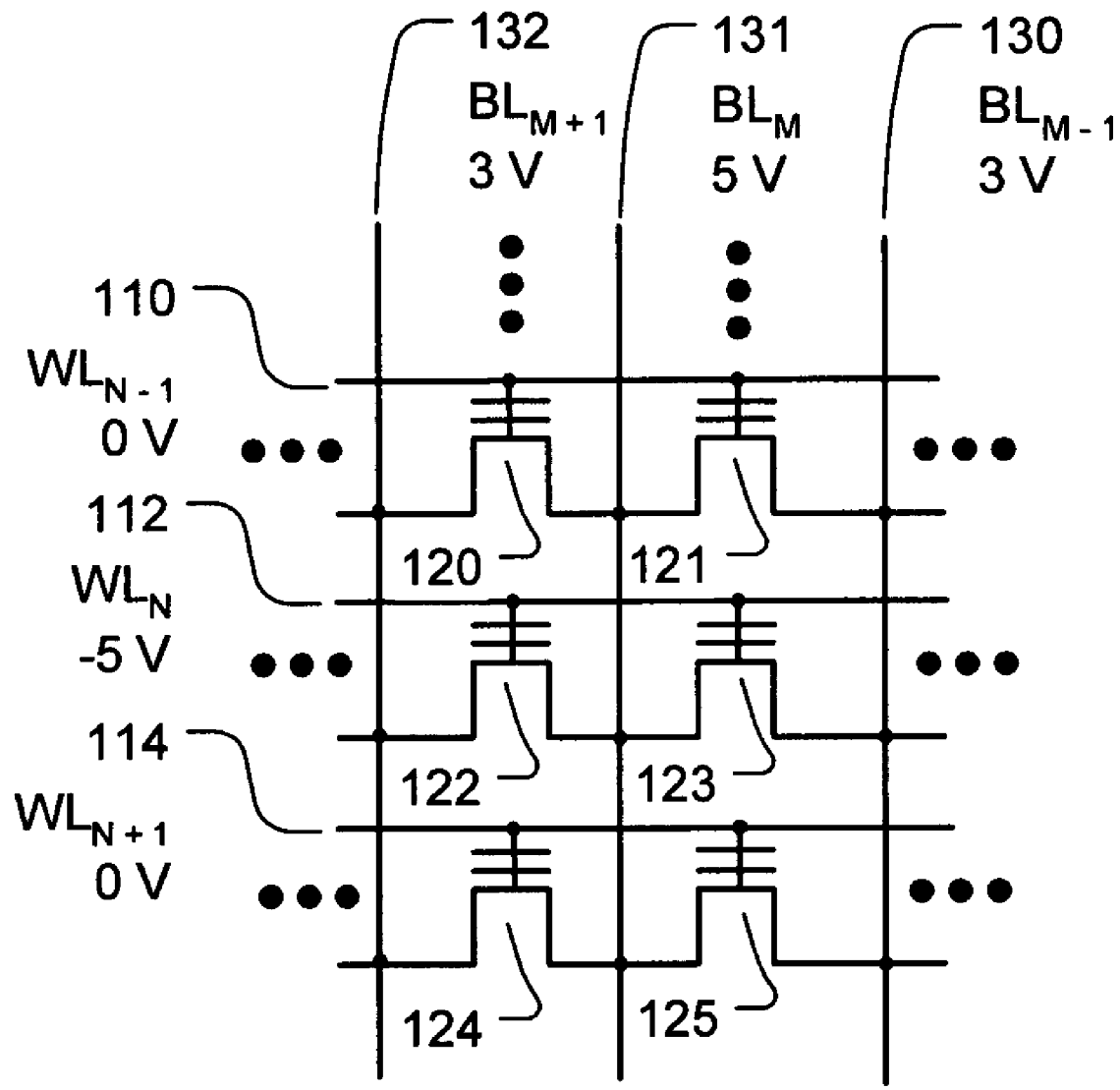
FIG. 2 is a simplified diagram of a portion of an array of nonvolatile memory cells not showing an addition of charge to neighboring cells.

FIG. 2 is a simplified diagram of a portion of an array of nonvolatile memory cells. In FIG. 2, bit line $BL_{M+1}$ 132 supplies a voltage of 3 V to a second current terminal of the first column of memory cells 120, 122, and 124. Bit line $BL_{M-1}$ 130 supplies a voltage of 3 V to a second current terminal of the second column of memory cells 121, 123, and 125. Despite the gate voltage that is insufficient to move energetic charge in the bodies of the nonvolatile memory cells 122 and 123 across the bottom dielectric into the charge trapping structure, nonvolatile memory cells 122 and 123 are not programmed. Nonvolatile memory cells 122 and 123 are not programmed because the voltage difference between bit line $BL_{M+1}$ 132 and bit line $BL_M$ 131 is too small for the column of nonvolatile memory cells 120, 122, and 124; and the voltage difference between bit line $BL_{M-1}$ 130 and bit line $BL_M$ 131 is too small for the column of nonvolatile memory cells 121, 123, and 125. The voltage difference between the bit line pairs is insufficient to induce energetic charge to the bodies of the memory cells. This type of programming has the advantage of maintaining a bias on bit line $BL_M$ 131 that is sufficient to induce energetic charge in the body of a nonvolatile memory cell if the other bit line of the memory cell is grounded, but programs neither nonvolatile memory cell 122 nor nonvolatile memory cell 123.

Figure 3:
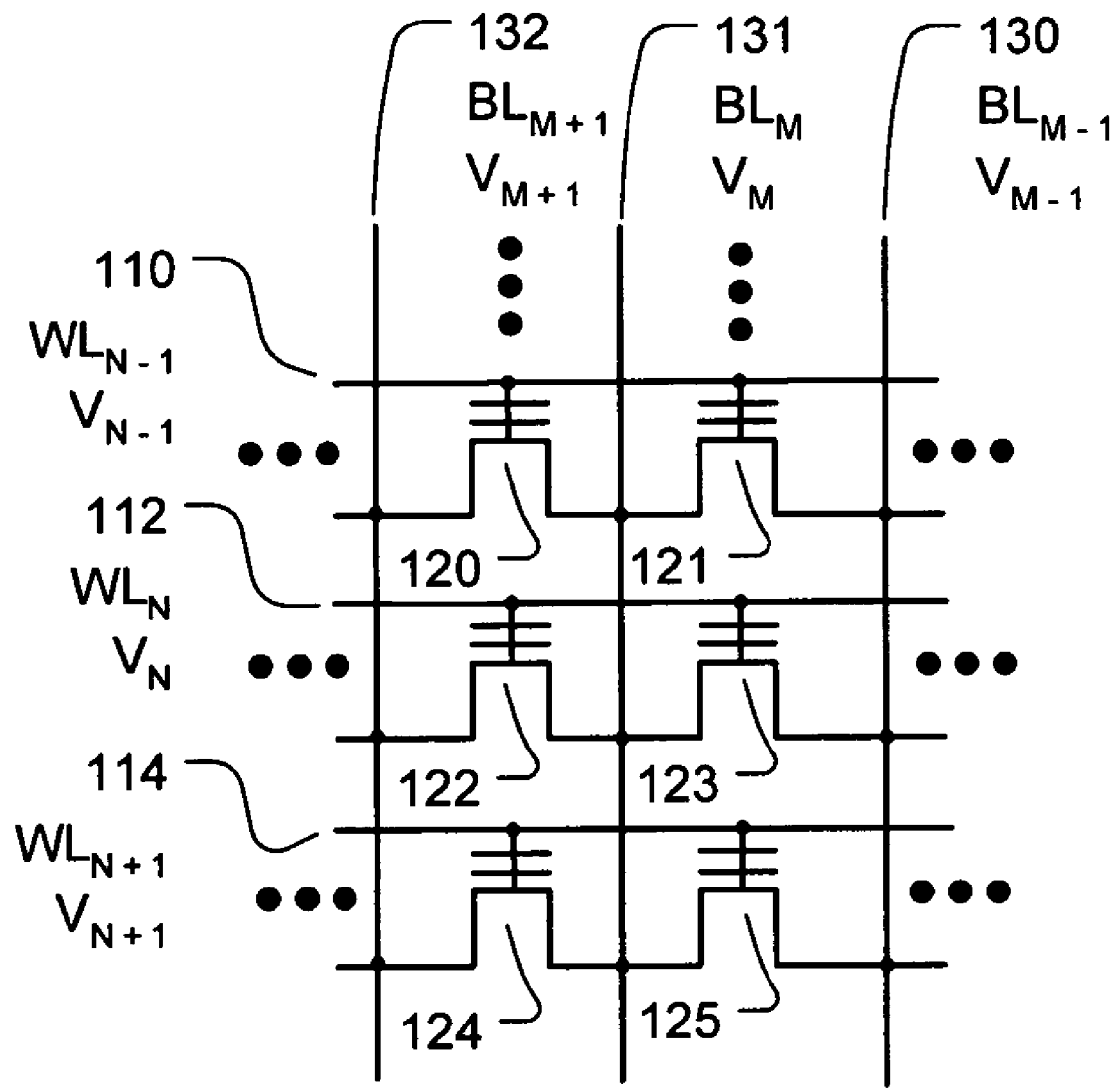
FIG. 3 is a simplified diagram of a portion of an array of nonvolatile memory cells that implements a decoded program instruction to add or not add charge to neighboring cells.

FIG. 3 is a simplified diagram of a portion of an array of nonvolatile memory cells. Word line $WL_{N-1}$ 110 supplies a gate voltage of $V_{N-1}$ to the row of nonvolatile memory cells 120 and 121. Word line $WL_N$ 112 supplies a gate voltage of $V_N$ to the row of nonvolatile memory cells 122 and 123. Word line $WL_{N+1}$ 114 supplies a gate voltage of $V_{N+1}$ to the row of nonvolatile memory cells 124 and 125. Bit line $BL_M$ 131 supplies a voltage of $V_M$ to a first current terminal of the first column of memory cells 120, 122, and 124, and to a first current terminal of the second column of memory cells 121, 123, and 125. Bit line $BL_{M+1}$ 132 supplies a voltage of $V_{M+1}$ to a second current terminal of the first column of memory cells 120, 122, and 124. Bit line $BL_{M-1}$ 130 supplies a voltage of $V_{M-1}$ to a second current terminal of the second column of memory cells 121, 123, and 125.

The nonvolatile memory array of FIG. 3 applies the voltages and voltage settings for the voltages $V_{N-1}$, $V_N$, $V_{N+1}$, $V_{M+1}$, $V_M$, $V_{M-1}$ as follows:

| Add charge to charge trapping structure part of cell 122 by bit line $BL_M$ | Add charge to charge trapping structure part of cell 123 by other bit line $BL_{M+1}/BL_{M-1}$ | $V_{M+1}$ | $V_M$ | $V_{M-1}$ | $V_{N-1}$ | $V_N$ | $V_{N+1}$ |
|---|---|---|---|---|---|---|---|
| Yes | Yes | 0 V | 5 V | 0 V | 0 V | −5 V | 0 V |
| Yes | No  | 0 V | 5 V | 3 V | 0 V | −5 V | 0 V |
| No  | Yes | 3 V | 5 V | 0 V | 0 V | −5 V | 0 V |
| No  | No  | 3 V | 5 V | 3 V | 0 V | −5 V | 0 V |
|     |     | 0 V | 0 V | 0 V | 0 V | −5 V | 0 V |

Figure 4:
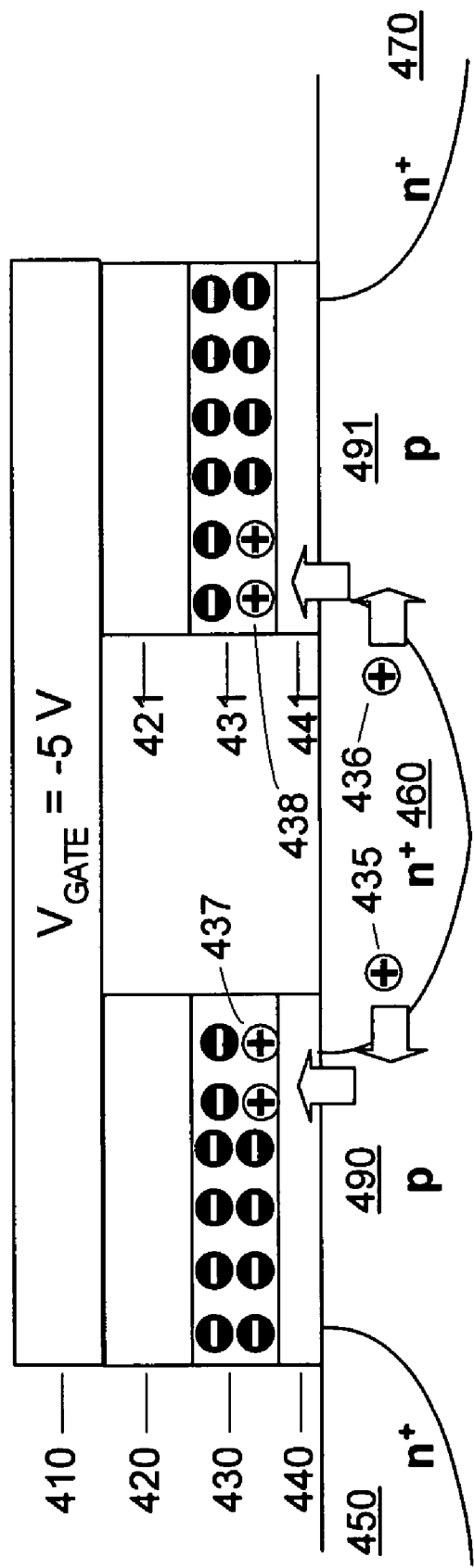
FIG. 4 is a more detailed diagram of neighboring nonvolatile memory cells showing the addition of charge to the neighboring cells.

FIG. 4 is a simplified diagram of two charge trapping memory cells sharing a word line and a bit line, showing a program operation being performed on the part of the charge trapping structure of each nonvolatile cell by the shared bit line. The p-doped substrate region 490 or 491 includes n+ doped current terminals 450, 460, and 470. n+ doped current terminal 460 is the first current terminal of both memory cells. The remainder of the first memory cell includes a bottom dielectric structure 440 on the substrate, a charge trapping structure 430 on the bottom dielectric structure 440 (bottom oxide), a top dielectric structure 420 (top oxide) on the charge trapping structure 430, and a gate 410 on the oxide structure 420. The remainder of the second memory cell includes a bottom dielectric structure 441 on the substrate, a charge trapping structure 431 on the bottom dielectric structure 441 (bottom oxide), a top dielectric structure 421 (top oxide) on the charge trapping structure 431, and a gate 410 on the oxide structure 421. The gate 410 is actually a word line providing a gate voltage to the oxide structure 420 of the first memory cell and the oxide structure 420 of the second memory cell. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to RuO2. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 4, the charge trapping structure part of each cell by the current terminal 460 of each memory cell has been programmed, for example via band-to-band hot hole injection of holes 435 and 436 into the charge trapping structures 430 and 431, respectively. Other program and erase techniques can be used in operation algorithms applied to the PHINES-type memory cell, as described for example in U.S. Pat. No. 6,690,601. Other memory cells and other operation algorithms might also be used.

Figure 5:
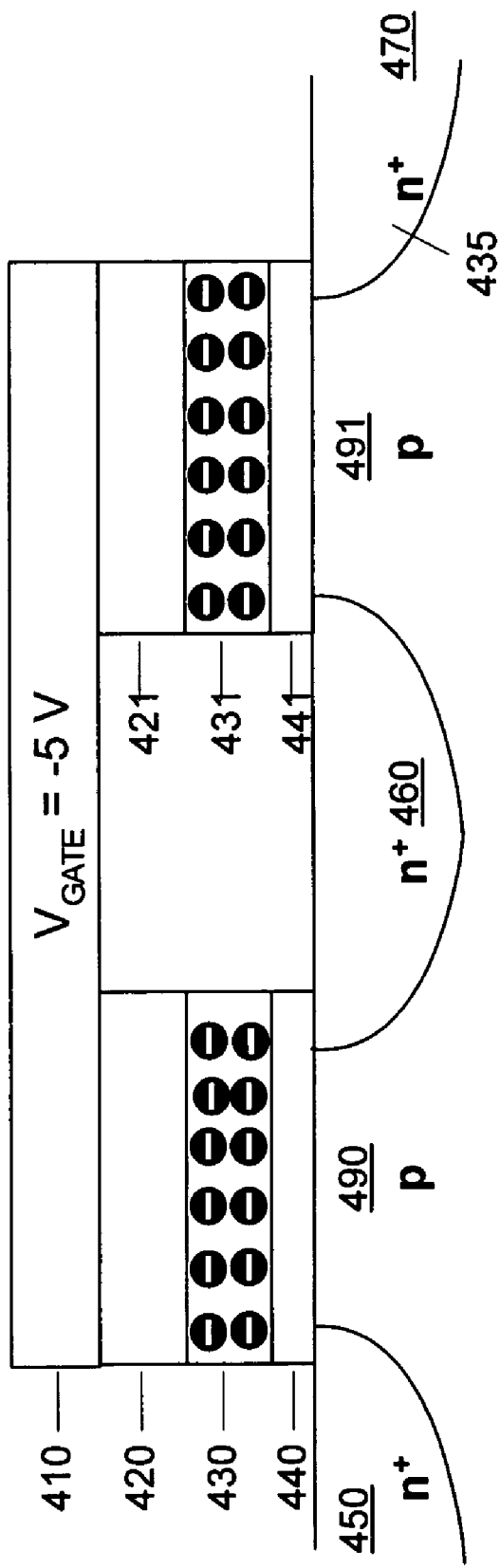
FIG. 5 is a more detailed diagram of neighboring nonvolatile memory cells not showing the addition of charge to the neighboring cells.

FIG. 5 is a simplified diagram of two charge trapping memory cells sharing a word line and a bit line. The voltage setting is changed in that neither of the memory cells is programmed. Even with a bias on bit line 460 that is sufficient to induce energetic charge in the bodies 490 and 491 of the nonvolatile memory cells with a corresponding voltage on the other bit line, the other bit line 450 and 470 has a voltage which causes an insufficient voltage difference between the bit line pairs that fails to induce energetic charge in the bodies 490 and 491 of the nonvolatile memory cells.

Figure 6:
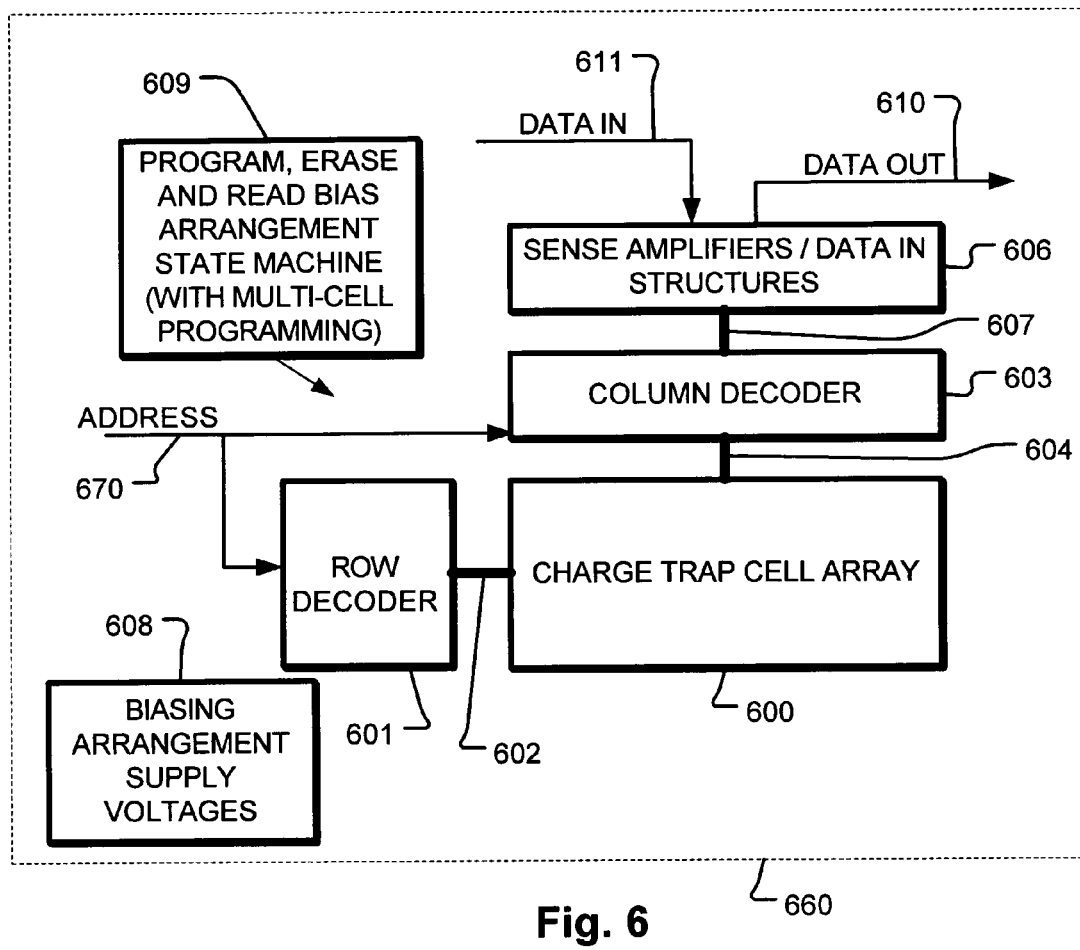
FIG. 6 is a simplified block diagram of a nonvolatile memory array with multi-cell programming according to an embodiment of the invention.

FIG. 6 is a simplified block diagram of an integrated circuit according to an embodiment. The integrated circuit 660 includes a memory array 600 implemented using charge trapping memory cells, on a semiconductor substrate. A row decoder 601 is coupled to a plurality of word lines 602 arranged along rows in the memory array 600. A column decoder 603 is coupled to a plurality of bit lines 604 arranged along columns in the memory array 600. Addresses are supplied on bus 670 to column decoder 603 and row decoder 601. Sense amplifiers and data-in structures in block 606 are coupled to the column decoder 603 via data bus 607. Data is supplied via the data-in line 611 from input/output ports on the integrated circuit 660, or from other data sources internal or external to the integrated circuit 660, to the data-in structures in block 606. Data is supplied via the data-out line 610 from the sense amplifiers in block 606 to input/output ports on the integrated circuit 660, or to other data destinations internal or external to the integrated circuit 660. A bias arrangement state machine 609 controls the application of bias arrangement supply voltages 608, such as for the erase verify and program verify voltages, and the arrangements for programming multiple selected cells, erasing, and reading the memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A programming method for first and second memory cells each having a body, a first current terminal and a second current terminal in the body, a gate terminal, a top dielectric, a charge trapping structure having parts corresponding to the first and second current terminals, and a bottom dielectric, wherein the gates of the first and second memory cells are coupled to a same word line, the first current terminals of the first and second memory cells are coupled to a same bit line, and the second current terminals of the first and second memory cells are coupled to different bit lines, the method comprising:

in response to a program command to add charge to the charge trapping structure of at least the first and second memory cells:
applying a first voltage to the same word line sufficient to move energetic charge from the body of memory cells across the bottom dielectric into the charge trapping structure;
applying a second voltage to the same bit line to induce the energetic charge in the body of memory cells having at least a sufficient voltage difference between the first current terminal and the second current terminal; and
applying a voltage setting to the different bit lines to cause at least the sufficient voltage difference between the first current terminal and the second current terminal to induce the energetic charge in the bodies of the first and second memory cells.

2. The method of claim 1, wherein the energetic charge induced by the sufficient voltage and moved into the charge trapping structure is channel initiated secondary charge.

3. The method of claim 1, wherein the energetic charge induced by the sufficient voltage and moved into the charge trapping structure is channel hot charge.

4. The method of claim 1, wherein the energetic charge induced by the sufficient voltage and moved into the charge trapping structure is induced by Fowler-Nordheim tunneling.

5. The method of claim 1, wherein the energetic charge induced by the sufficient voltage and moved into the charge trapping structure is induced by band-to-band tunneling.

6. The method of claim 1, wherein the voltage setting applies a same voltage to the different bit lines.

7. The method of claim 1, wherein the voltage setting applies different voltages to the different bit lines.

8. A programming method for first and second memory cells each having a body, a first current terminal and a second current terminal in the body, a gate terminal, a top dielectric, a charge trapping structure having parts corresponding to the first and second current terminals, and a bottom dielectric, wherein the gates of the first and second memory cells are coupled to a same word line, the first current terminals of the first and second memory cells are coupled to a same bit line, and the second current terminals of the first and second memory cells are coupled to different bit lines, the method comprising:

in response to a program command to not add charge to the charge trapping structure of at least the first and second memory cells:
applying a first voltage to the same word line sufficient to move energetic charge from the body of memory cells across the bottom dielectric into the charge trapping structure;
applying a second voltage to the same bit line to induce the energetic charge in the body of memory cells having at least a sufficient voltage difference between the first current terminal and the second current terminal; and
applying a voltage setting to the different bit lines to cause an insufficient voltage difference between the first current terminal and the second current terminal failing to induce the energetic charge in the bodies of the first and second memory cells.

9. The method of claim 8, wherein the energetic charge induced by the sufficient voltage and moved into the charge trapping structure is channel initiated secondary charge.

10. The method of claim 8, wherein the energetic charge induced by the sufficient voltage and moved into the charge trapping structure is channel hot charge.

11. The method of claim 8, wherein the energetic charge induced by the sufficient voltage and moved into the charge trapping structure is induced by Fowler-Nordheim tunneling.

12. The method of claim 8, wherein the energetic charge induced by the sufficient voltage and moved into the charge trapping structure is induced by band-to-band tunneling.

13. The method of claim 8, wherein the voltage setting applies a same voltage to the different bit lines.

14. The method of claim 8, wherein the voltage setting applies different voltages to the different bit lines.

15. A programming method for first and second memory cells each having a body, a first current terminal and a second current terminal in the body, a gate terminal, a top dielectric, a charge trapping structure having parts corresponding to the first and second current terminals, and a bottom dielectric, wherein the gates of the first and second memory cells are coupled to a same word line, the first current terminals of the first and second memory cells are coupled to a same bit line, and the second current terminals of the first and second memory cells are coupled to different bit lines, the method comprising:

in response to a program command:

applying a first voltage to the same word line sufficient to move energetic charge from the body of memory cells across the bottom dielectric into the charge trapping structure; and applying a second voltage to the same bit line to induce the energetic charge to the body of memory cells having at least a sufficient voltage difference between the first current terminal and the second current terminal; and applying a voltage setting to the different bit lines depending on the program command as follows:

if the program command is to add charge to the charge trapping structure of the memory cells in the first and second columns, applying the voltage setting to the second and third bit lines to cause at least the sufficient voltage difference between the first current terminal and the second current terminal to induce the energetic charge in the bodies of the first and second columns of memory cells;

if the program command is to not add charge to the charge trapping structure of the memory cells in the first and second columns, applying the voltage setting to the second and third bit lines to cause an insufficient voltage difference between the first current terminal and the second current terminal failing to induce the energetic charge in the bodies of the first and second columns of memory cells;

if the program command is to add charge to the charge trapping structure of the at least one memory cell in the first column and not add charge to the charge trapping structure of the at least one memory cell in the second column, applying the voltage setting to the second and third bit lines to cause: 1) at least the sufficient voltage difference between the first current terminal and the second current terminal of the first memory cell to induce the energetic charge in the bodies of the first column of memory cells and 2) the insufficient voltage difference between the first current terminal and the second current terminal of the second memory cell failing to induce the energetic charge in the bodies of the second column of memory cells; and if the program command is to not add charge to the charge trapping structure of at least one memory cell in the first colunm and add charge to the charge trapping structure of at least one memory cell in the second column, applying the voltage setting to the second and third bit lines to cause: 1) the insufficient voltage difference between the first current terminal and the second current terminal of the first memory cell failing to induce the energetic charge in the bodies of the first column of memory cells and 2) at least the sufficient voltage difference between the first current terminal and the second current terminal of the second memory cell to induce the energetic charge in the bodies of the second column of memory cells.

16. The method of claim 15, wherein the energetic charge induced by the sufficient voltage and moved into the charge trapping structure is channel initiated secondary charge.

17. The method of claim 15, wherein the energetic charge induced by the sufficient voltage and moved into the charge trapping structure is channel hot charge.

18. The method of claim 15, wherein the energetic charge induced by the sufficient voltage and moved into the charge trapping structure is induced by Fowler-Nordheim tunneling.

19. The method of claim 15, wherein the energetic charge induced by the sufficient voltage and moved into the charge trapping structure is induced by band-to-band tunneling.

20. The method of claim 15, wherein the voltage setting applies a same voltage to the different bit lines.

21. The method of claim 15, wherein the voltage setting applies different voltages to the different bit lines.

22. A nonvolatile memory, comprising:

an array of memory cells arranged in rows including at least a first row and columns including at least a first colunm and a second column, each memory cell including:

a body;

a first current terminal in the body;

a second current terminal in the body;

a bottom dielectric coupled to the body;

a charge trapping structure coupled to the bottom dielectric having parts corresponding to the source first current terminal and the second current terminal, each of the parts having a charge storage state; and a top dielectric coupled to the charge trapping structure;

a plurality of word lines coupled to the top dielectrics of the plurality of memory cells including at least a first word line, wherein memory cells in the first row of the array of memory cells receive a gate voltage from the first word line;

a plurality of bit lines coupled to the first current terminal and the second terminal of memory cells in the array, including:

a first bit line coupled to the first current terminal of memory cells in the first column and the second column;

a second bit line coupled to the second current terminal of memory cells in the first column; and a third bit line coupled to the second current terminal of memory cells in the second column; and logic coupled to the plurality of memory cells, said logic responding to a program command to add charge to the charge trapping structure of at least memory cells in the first and second columns by performing:

applying a first voltage to the first word line sufficient to move energetic charge from the body of memory cells across the bottom dielectric into the charge trapping structure;

applying a second voltage to the first bit line to induce the energetic charge in the body of memory cells having at least a sufficient voltage difference between the first current terminal and the second current terminal; and applying a voltage setting to the second and third bit lines to cause at least the sufficient voltage difference between the first current terminal and the second current terminal to induce the energetic charge in the bodies of the first and second columns of memory cells.

23. The memory of claim 22, wherein the energetic charge induced by the sufficient voltage and moved into the charge trapping structure is channel initiated secondary charge.

24. The memory of claim 22, wherein the energetic charge induced by the sufficient voltage and moved into the charge trapping structure is channel hot charge.

25. The memory of claim 22, wherein the energetic charge induced by the sufficient voltage and moved into the charge trapping structure is induced by Fowler-Nordheim tunneling.

26. The memory of claim 22, wherein the energetic charge induced by the sufficient voltage and moved into the charge trapping structure is induced by band-to-band tunneling.

27. The memory of claim 22, wherein the voltage setting applies a same voltage to the different bit lines.

28. The memory of claim 22, wherein the voltage setting applies different voltages to the different bit lines.

29. A nonvolatile memory, comprising:
an array of memory cells arranged in rows including at least a first row and columns including at least a first column and a second column, each memory cell including:
a body;
a first current terminal in the body;
a second current terminal in the body;
a bottom dielectric coupled to the body;
a charge trapping structure coupled to the bottom dielectric having parts corresponding to the source first current terminal and the second current terminal, each of the parts having a charge storage state; and
a top dielectric coupled to the charge trapping structure;
a plurality of word lines coupled to the top dielectrics of the plurality of memory cells including at least a first word line, wherein memory cells in the first row of the array of memory cells receive a gate voltage from the first word line;
a plurality of bit lines coupled to the first current terminal and the second terminal of memory cells in the array, including:
a first bit line coupled to the first current terminal of memory cells in the first column and the second column;
a second bit line coupled to the second current terminal of memory cells in the first column; and
a third bit line coupled to the second current terminal of memory cells in the second column; and
logic coupled to the plurality of memory cells, said logic responding to a program command to not add charge to the charge trapping structure of at least memory cells in the first and second columns by performing:
applying a first voltage to the same word line sufficient to move energetic charge in the body of memory cells across the bottom dielectric into the charge trapping structure;
applying a second voltage to the first bit line to induce the energetic charge in the body of memory cells having at least a sufficient voltage difference between the first current terminal and the second current terminal; and
applying a voltage setting to the second and third bit lines to cause an insufficient voltage difference between the first current terminal and the second current terminal failing to induce the energetic charge in the bodies of the first and second columns of memory cells.

30. The memory of claim 29, wherein the energetic charge induced by the sufficient voltage and moved into the charge trapping structure is channel hot charge.

31. The memory of claim 29, wherein the energetic charge induced by the sufficient voltage and moved into the charge trapping stucture is channel hot charge.

32. The memory of claim 29, wherein the energetic charge induced by the sufficient voltage and moved into the charge trapping structure is induced by Fowler-Nordheim tunneling.

33. The memory of claim 29, wherein the energetic charge induced by the sufficient voltage and moved into the charge trapping structure is induced by band-to-band tunneling.

34. The memory of claim 29, wherein the voltage setting applies a same voltage to the different bit lines.

35. The memory of claim 29, wherein the voltage setting applies different voltages to the different bit lines.

36. A nonvolatile memory, comprising:
an array of memory cells arranged in rows including at least a first row and columns including at least a first column and a second column, each memory cell including:
a body;
a first current terminal in the body;
a second current terminal in the body;
a bottom dielectric coupled to the body;
a charge trapping structure coupled to the bottom dielectric having parts corresponding to the source first current terminal and the second current terminal, each of the parts having a charge storage state; and
a top dielectric coupled to the charge trapping structure;
a plurality of word lines coupled to the top dielectrics of the plurality of memory cells including at least a first word line, wherein memory cells in the first row of the array of memory cells receive a gate voltage from the first word line;
a plurality of bit lines coupled to the first current terminal and the second terminal of memory cells in the array, including:
a first bit line coupled to the first current terminal of memory cells in the first column and the second column;
a second bit line coupled to the second current terminal of memory cells in the first column; and
a third bit line coupled to the second current terminal of memory cells in the second column; and
logic coupled to the plurality of memory cells, said logic responding to response to a program command by performing:
applying a first voltage to the first word line sufficient to move energetic charge from the body of memory cells across the bottom dielectric into the charge trapping structure;
applying a second voltage to the first bit line to induce the energetic charge in the body of memory cells having at least a sufficient voltage difference between the first current terminal and the second current terminal;
applying a voltage setting to the different bit lines depending on the program command as follows:
if the program command is to add charge to the charge trapping structure of the first and second memory cells, applying the voltage setting to the different bit lines to cause at least the sufficient voltage difference between the first current terminal and the second current terminal to induce the energetic charge in the bodies of the first and second memory cells;

if the program command is to not add charge to the charge trapping structure of the first and second memory cells, applying the voltage setting to the different bit lines to cause an insufficient voltage difference between the first current terminal and the second current terminal failing to induce the energetic charge in the bodies of the first and second memory cells;

if the program command is to add charge to the charge trapping structure of the first memory cell and not add charge to the charge trapping structure of the second memory cell, applying the voltage setting to the different bit lines to cause: 1) at least the sufficient voltage difference between the first current terminal and the second current terminal of the first memory cell to induce the energetic charge in the body of the first memory cell and 2) the insufficient voltage difference between the first current terminal and the second current terminal of the second memory cell failing to induce the energetic charge in the body of the second memory cell; and if the program command is to not add charge to the charge trapping structure of the first memory cell and add charge to the charge trapping structure of the second memory cell, applying the voltage setting to the different bit lines to cause: 1) the insufficient voltage difference between the first current terminal and the second current terminal of the first memory cell failing to induce the energetic charge in the body of the first memory cell and 2) at least the sufficient voltage difference between the first current terminal and the second current terminal of the second memory cell to induce the energetic charge in the body of the second memory cell.

37. The memory of claim 36, wherein the energetic charge induced by the sufficient voltage and moved into the charge trapping structure is channel initiated secondary charge.

38. The memory of claim 36, wherein the energetic charge induced by the sufficient voltage and moved into the charge trapping structure is channel hot charge.

39. The memory of claim 36, wherein the energetic charge induced by the sufficient voltage and moved into the charge trapping structure is induced by Fowler-Nordheim tunneling.

40. The memory of claim 36, wherein the energetic charge induced by the sufficient voltage and moved into the charge trapping structure is induced by band-to-band tunneling.

41. The memory of claim 36, wherein the voltage setting applies a same voltage to the different bit lines.

42. The memory of claim 36, wherein the voltage setting applies different voltages to the different bit lines.

* * * * *